(12) United States Patent
Holt et al.

(10) Patent No.: US 10,262,903 B2
(45) Date of Patent: Apr. 16, 2019

(54) BOUNDARY SPACER STRUCTURE AND INTEGRATION

(71) Applicant: GLOBALFOUNDRIES INC., Grand Cayman (KY)

(72) Inventors: Judson R. Holt, Ballston Lake, NY (US); Yi Qi, Niskayuna, NY (US); Hsien-Ching Lo, Clifton Park, NY (US); Jianwei Peng, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/630,547

(22) Filed: Jun. 22, 2017

(65) Prior Publication Data
US 2018/0374759 A1    Dec. 27, 2018

(51) Int. Cl.
*H01L 21/8238* (2006.01)
*H01L 21/02* (2006.01)
*H01L 27/092* (2006.01)
*H01L 29/08* (2006.01)
*H01L 29/06* (2006.01)

(52) U.S. Cl.
CPC ........ *H01L 21/823814* (2013.01); *H01L 21/02178* (2013.01); *H01L 21/823821* (2013.01); *H01L 21/823864* (2013.01); *H01L 27/0924* (2013.01); *H01L 29/0653* (2013.01); *H01L 29/0847* (2013.01); *H01L 21/823878* (2013.01)

(58) Field of Classification Search
CPC ........... H01L 21/82381; H01L 29/0653; H01L 21/823878; H01L 21/823821; H01L 29/0847; H01L 27/0924; H01L 21/02178
See application file for complete search history.

(56) References Cited

U.S. PATENT DOCUMENTS

2013/0052781 A1* 2/2013 Dai .................. H01L 29/66795
                                                                438/275
2017/0170181 A1* 6/2017 Seo ..................... H01L 27/0924

FOREIGN PATENT DOCUMENTS

CN         101542697         9/2009

* cited by examiner

*Primary Examiner* — Cuong B Nguyen
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to an N-P boundary spacer structure used with finFET devices and methods of manufacture. The method includes forming a plurality of first fin structures, forming a blocking layer between a first fin structure of the plurality of fin structures and a second fin structure of the plurality of fin structures, and forming an epitaxial material on the first fin structure, while blocking the epitaxial material from extending onto the second fin structure by at least the blocking layer formed between the first fin structure and the second fin structure.

15 Claims, 4 Drawing Sheets

BOUNDARY SPACER STRUCTURE AND INTEGRATION

FIELD OF THE INVENTION

The present disclosure relates to semiconductor structures and, more particularly, to a boundary spacer structure used with finFET devices and methods of manufacture.

BACKGROUND

As technology nodes advance, smaller and smaller spaces are provided between the n-EPI and the p-EPI layers formed on adjacent fin structures. For example, in 7 nm structures the space for the n-EPI and p-EPI is generally only around 50 nm or less. This small spacing can lead to N-P shorting either between the n-EPI and p-EPI or between the n-EPI and the Vdd power supply layer for the adjacent device. For example, during epitaxial growth processes performed on the adjacent fins, variations can occur in the size of the epitaxial growth, or abnormal epitaxial growth can occur, which expands beyond the masks formed on the respective fins resulting in a merging of the epitaxial material.

An approach to resolving this issue is to reduce the growth time for the formation of the epitaxial layers on the fins since the actual size of the EPI layer is a function of the growth time. However, this can lead to the formation of inadequate EPI layers which, in turn, will restrict device performance, particularly since the EPI layers are used for forming the source and drain regions for finFET devices. Another approach to reduce the likelihood of shorting between the epitaxial layers of adjacent fin structures is to use remaining portions of sidewall spacers on the sides of the fins to constrain the epitaxial growth, since the space between the n-EPI and the p-EPI is insufficient for full EPI growth in 7 nm node technology. However, again, this results in an EPI volume which is significantly smaller than desirable, and thus restricts device performance.

SUMMARY

In an aspect of the disclosure a method comprising: forming a plurality of first fin structures; forming a blocking layer between a first fin structure of a first device and a second fin structure of a second device of the plurality of fin structures; and forming an epitaxial material on the first fin structure, while blocking the epitaxial material from extending onto the second fin structure by at least the blocking layer formed between the first fin structure and the second fin structure.

In an aspect of the disclosure a method comprises: forming a first fin structure for a first device type; forming a second fin structure for a second device type adjacent to the first device type; forming a mask over the first fin structure; forming a blocking material over the second fin structure and the mask; partially removing the blocking material to leave a blocking material on a sidewall of the second fin structure and a sidewall of the mask; removing the mask to form a vertical blocking layer at a boundary between the first device type and the second device type; and growing an epitaxial layer on the second fin structure, while the vertical blocking layer prevents the epitaxial layer extending beyond the boundary.

In an aspect of the disclosure an intermediate structure comprises: a first fin structure of a first device; a second fin structure of a second device, adjacent to the first fin structure; a blocking material at a boundary between the first device and the second device; and an epitaxial material on the first fin structure within the boundary of the first device and epitaxial material on the second fin structure within the boundary of the second device. The blocking material is structured to prevent the epitaxial material of the first fin structure and the second fin structure from merging together and extending beyond the boundary.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
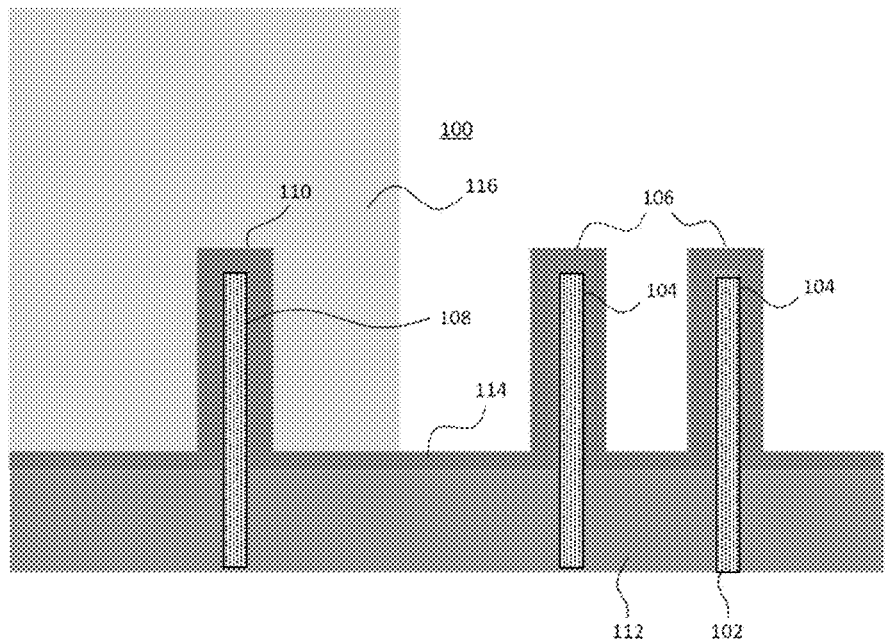
FIG. 1 shows an incoming structure and respective fabrication processes in accordance with aspects of the present disclosure.

The present disclosure relates to semiconductor structures and, more particularly, to a boundary spacer structure used with finFET devices and methods of manufacture. More specifically, the present disclosure provides a physical boundary in the form of a blocking layer between fin structures of adjacent devices, e.g., PFET and NFET, to prevent merging of epitaxial layers in a space between adjacent fin structures. Advantageously, in embodiments, the blocking layer between the adjacent fin structures will prevent epitaxial layers from merging together resulting in shorting of devices. In addition, the boundary prevents the epitaxial layer of one fin structure from shorting to a Vdd power supply line of an adjacent fin structure.

In more specific embodiments, in the present disclosure a mask is formed over a first fin structure on a first device and a blocking material is formed over the mask and an exposed second fin structure of a second device. Portions of the blocking layer are then partially removed, leaving the blocking material on a sidewall of the mask on the fin structure of the first device and the second fin structure. The mask covering the first fin structure can be removed leaving a vertical extent of the blocking layer between the fin structures of different devices. An epitaxial growth process can then be performed to grow, e.g., source and drain regions. The blocking material will prevent the epitaxial layer formed on either the fin structure of the first device or the second device from crossing a boundary between two different devices. Still further, the blocking material between adjacent fin structures can be formed without additional processing steps, e.g., masking steps, thereby simplifying manufacturing processes.

It is also noted that although the above description has been provided with regard to PFET and NFET devices, the present disclosure can be used in conjunction with inserting a blocking layer between any two fin structures, and is not limited to an N-P boundary. For example, the blocking layer can be inserted to eliminate N/N shorts or P/P shorts, in addition to other devices.

The structures and methods of the present disclosure can be manufactured and performed in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the disclosed structures and the disclosed methods use three basic building blocks: (i) deposition of thin films of material on a substrate, (ii) applying a patterned mask on top of the films by photolithographic imaging, and (iii) etching the films selectively to the mask.

FIG. 1 shows an incoming structure and respective fabrication processes in accordance with aspects of the present disclosure. More specifically, FIG. 1 illustrates a finFET structure 100 comprising a plurality of fins structures 104, 108. In embodiments, the fin structures 104, 108 are formed from a substrate material 102. In 7 nm node technology, for example, the typical spacing between the fin structures 108 and the fin structures 104 can be about 20-50 nm. In embodiments, the substrate material 102 may be composed of any suitable semiconductor material including, but not limited to, Si, SiGe, SiGeC, SiC, GaAs, InAs, InP, and other III/V or II/VI compound semiconductors.

In embodiments, the fin structures 104, 108 can be formed from a sidewall image technique (SIT). In an example of a SIT technique, a mandrel material, e.g., $SiO_2$, is deposited on the substrate 102 using conventional chemical vapor deposition (CVD) processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the narrow fin structures 104, 108 and/or wide fin structures.

Spacers are formed on the sidewalls of the mandrels which are preferably material that is different than the mandrels, and which are formed using conventional deposition processes known to those of skill in the art. The spacers can have a width which matches the dimensions of the narrow fin structures 104, 108, for example. The mandrels are removed or stripped using a conventional etching process, selective to the mandrel material. An etching is then performed within the spacing of the spacers to form the sub-lithographic features. The sidewall spacers can then be stripped. In embodiments, the wide fin structures can also be formed during this or other patterning processes, or through other conventional patterning processes, as contemplated by the present disclosure. The fin structure 104 can be used to form a PFET 106 side of the structure; whereas, the fin structure 108 can be used to form an NFET side 110 of the structure.

A shallow trench isolation structure (STI) 112 is formed between the fin structures 104, 108. In embodiments, the STI structures 112 can be formed by conventional lithography, etching and deposition processes as is known in the art. In further embodiments, a spacer material 114, e.g., nitride or other dielectric material, is formed over the fin structures 104, 108. In more specific embodiments, the spacer material 114 can be any insulator material that provides selectivity for subsequent materials and etching processes. The spacer material 114 can be formed to a thickness of about 2 nm to about 10 nm using conventional chemical vapor deposition (CVD), plasma enhanced CVD (PECVD) or other conformal deposition processes. Further, the fin structures 104 (e.g., NFET side 110 of the device) are covered by a lithography mask 116 (i.e., a photo resist masking layer).

Figure 2:
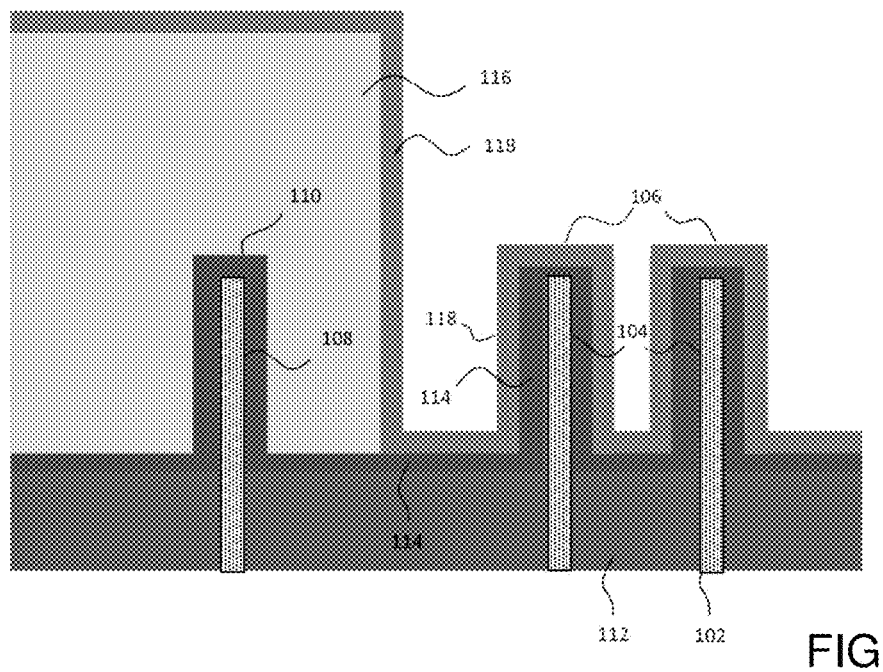
FIG. 2 shows a blocking layer over a mask and fin structures, amongst other features, and respective fabrication processes in accordance with aspects of the present disclosure.

FIG. 2 shows a blocking layer 118 over the mask 116 and fin structures 104. More specifically, in FIG. 2, the blocking layer 118 is an N-P blocking layer formed over the mask 116 and the fin structures 104. In embodiments, the blocking layer 118 can be formed of any insulator material that does not allow crystalline growth of epitaxial material. In embodiments, for example, the blocking layer 118 can be composed of metal oxides, including but not limited to, $Al_2O_3$. Additional materials can include, e.g., SiOC, or other insulator materials. The blocking layer 118 is preferably formed to have a thickness of about 2 nm to about 12 nm, and is deposited using conventional techniques such as CVD or PECVD processes.

Figure 3:
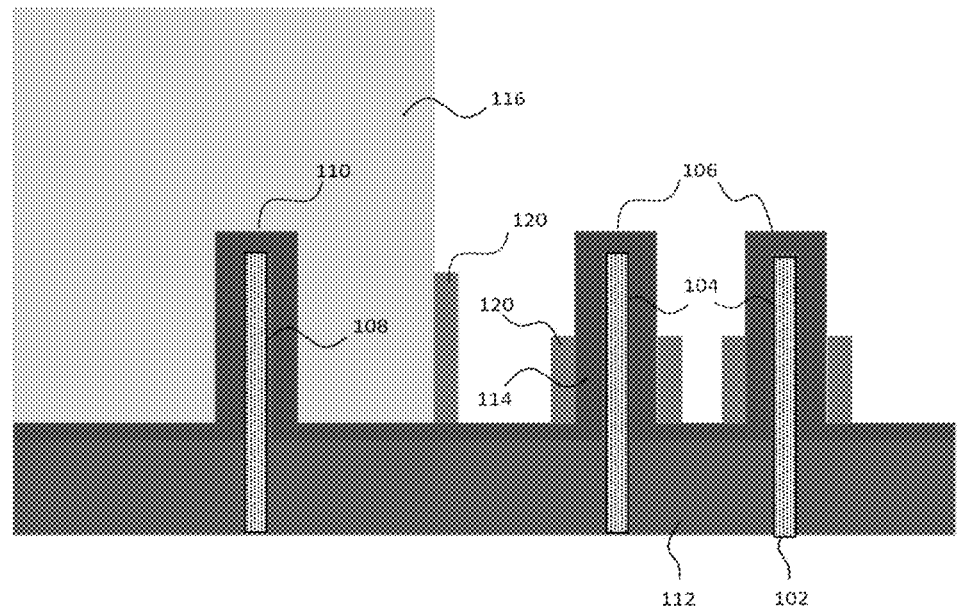
FIG. 3 shows vertical portions of the blocking layer on a mask and over fin structures, amongst other features, and respective fabrication processes in accordance with aspects of the present disclosure.

FIG. 3 shows the structure following removal of portions of the blocking layer 118. Specifically, as shown in FIG. 3, horizontal surfaces of the blocking layer 118 are removed by an anisotropic etching process. This process results in vertical portions 120 of the blocking layer 118 remaining on sidewalls of the spacer material 114 of the fin structures 104 on the PFET side 106 of the device, while the remaining horizontal surfaces of the blocking layer are removed. In this way, the vertical portions 120 on the spacer material 114 can be used to form a spacer on the sidewalls of the fin structures 104, 108. In this process, the vertical portions of the blocking layer 118 may also be slightly recessed by the etching process.

In embodiments, and advantageously, an N-P boundary or barrier 122 and sidewall spacers on the fin structures 104, 108 can be formed without separate masking steps. In other words, the initial formation of the blocking layer 118 shown in FIG. 2 permits forming both an N-P boundary (to prevent shorting between the epitaxial layers of the PFET sides 106 of the structure and the NFET side 110 of the structure) and the sidewall spacers 120 without the need for separate masking steps. Regarding this, it is noted that the sidewall spacers 120 can also serve to prevent diffusion of undesirable dopants and impurities into lower portions of the PFET side 106 or NFET side 110 of the structure during subsequent source and drain formation. In embodiments, the sidewall spacers 120 can be separated from upper surfaces of the substrate 102 and the STI 112 by a portion of the spacer material 114 on which the sidewall lining spacers are formed.

Figure 4:
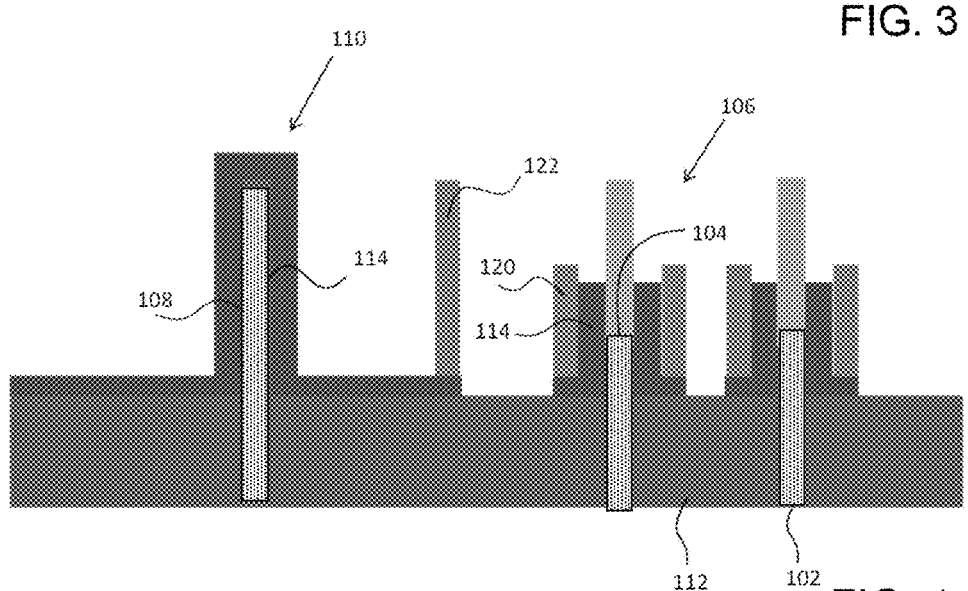
FIG. 4 shows a spacer layer partially removed to expose the fin structures, amongst other features, and respective fabrication processes in accordance with aspects of the present disclosure.

In FIG. 4, the spacer material 114 is partially removed to expose the fin structures 104, amongst other features. In embodiments, the spacer material 114 can be partially removed by a nitride etch, for example. Note that the vertical portions 120 of the blocking layer will act as a mask during this etching process, preventing the full removal of the spacer material 114. The spacer etch will also expose portions of the fin structures 104 for subsequent epitaxial growth processes. Following the spacer etch, the fin structures 104 will be partially recessed to below the height of the spacer material 114. In embodiments, the recess of the fin structures 104 can be provided by a reactive ion etching (RIE) process with a selective chemistry. As can be appreciated from FIG. 4, the fin structures 104 for the PFET side 106 of the structure are now exposed, making them available for subsequent epitaxial growth processes.

Still referring to FIG. 4, the masking material is removed by a conventional oxygen ashing process or other stripant process on the NFET side 110 of the device. In this way, a portion of the blocking layer 122 will remain between the NFET side 110 and the PFET side 106, forming an N-P boundary or barrier 122 between the NFET side 110 and the PFET side 106 of the structure. This N-P boundary or barrier 122 will restrict or prevent epitaxial growth from expanding beyond the PFET side 106 of the device. Accordingly, shorting between the different devices, e.g., PFET device 106 and NFET device 110 can be avoided.

In embodiments, the N-P boundary or barrier 122 can have a boundary height of at least 30 nm for a case where an initial fin height is about 45 nm before etching of the fin structures. It should be recognized, though, that other heights of the N-P boundary or barrier 122 are also contemplated herein, e.g., 50 nm, 53 nm, etc. The thickness of the N-P boundary or barrier 122 can be in the range of about 2 nm to about 12 nm, with a preferred thickness of about 10 nm to about 12 nm. It is noted that although FIG. 4 shows the arrangement of the fin structures 104 being exposed, the processes are also contemplated to first expose the fin structure 108 of the NFET side 110.

Figure 5:
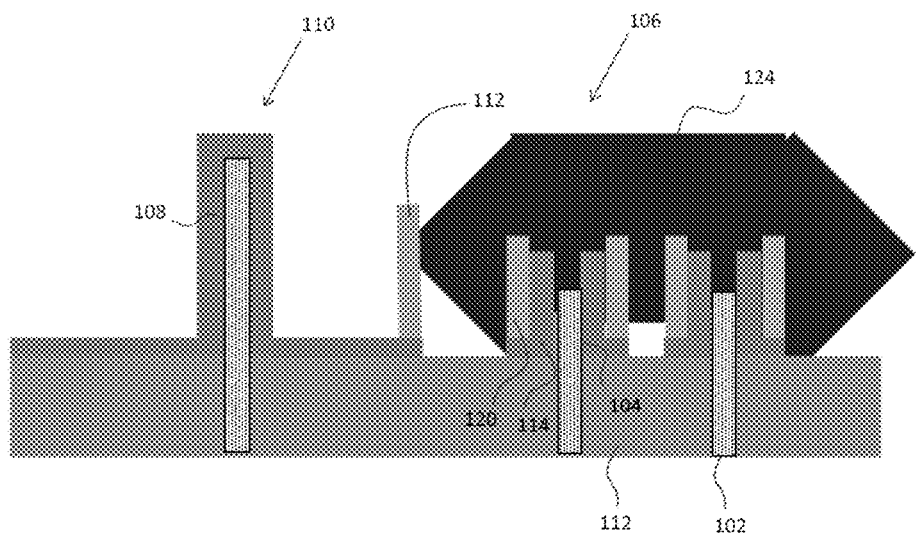
FIG. 5 shows an epitaxial growth on exposed portions of fin structures, amongst other features, and respective fabrication processes in accordance with aspects of the present disclosure.

As shown in FIG. 5, an epitaxial growth process is performed on the exposed portions of the fin structures 104 forming an epitaxial layer 124, e.g., p-EPI layer. The epitaxial layer 124 can be used for raised source and drain regions, for example. In accordance with the present disclosure, the N-P boundary or barrier 122 will form a boundary to prevent the epitaxial layer 124 from expanding beyond the N-P boundary or barrier 122 into the area around the fin structure 108 of the NFET side 110 of the structure. As such, the N-P boundary or barrier 122 will prevent shorting between the epitaxial layer 124 and elements of the NFET side 110 of the structure. In addition, as should be understood by those of skill in the art, the spacer material 114 on the fin structure 108 will prevent the epitaxial material from growing on the PFET side 110 of the structure.

Figure 6:
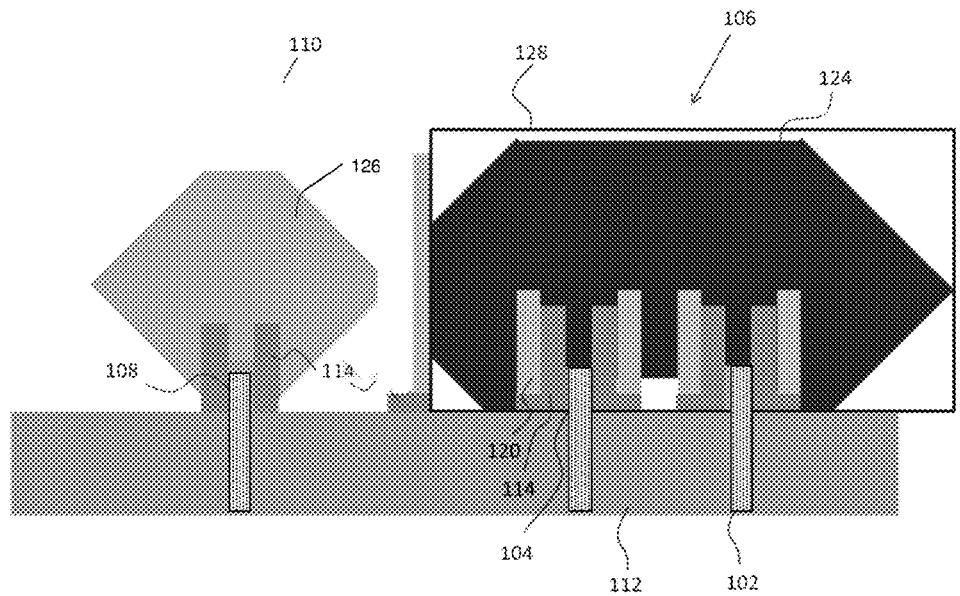
FIG. 6 shows an epitaxial growth on exposed portions of other fin structures, amongst other features, and respective fabrication processes in accordance with aspects of the present disclosure.

FIG. 6 shows the formation of an epitaxial material 126 on the NFET side 110 of the structure. For example, in FIG. 6, the mask on the NFET side 110 of the structure is removed, and a mask 128 is formed on the PFET side 106 of the structure. More specifically, the mask 128 is formed over the epitaxial layer 124. Thereafter, the spacer material 114 is partially removed to expose the fin structure 108. In embodiments, the spacer material 114 can be partially removed by a nitride etch, for example. The spacer etch will also expose portions of the fin structures 108. Following the spacer etch, the fin structures 108 will be partially recessed to below the height of the spacer material 114. In embodiments, the recess of the fin structures 108 can be provided by a RIE process with a selective chemistry. As can be appreciated from FIG. 6, the fin structure 108 for the NFET side 110 of the structure is now exposed, making it available for subsequent epitaxial growth.

Still referring to FIG. 6, an epitaxial growth process is performed on the exposed portions of the fin structure 108 forming an epitaxial layer 126, e.g., n-EPI layer. In accordance with the present disclosure, the N-P boundary or barrier 122 will prevent the epitaxial layer 126 from expanding beyond the N-P boundary or barrier 122 into the area around the fin structures 104 of the PFET side of the device 106. More specifically, at this stage of the process, the N-P boundary or barrier 122 will prevent the epitaxial layer 126 merging with the epitaxial layer 124. In this way, shorting of the devices is prevented. After the growth process, the mask 128 can be removed by any conventional removal process, e.g., oxygen ashing or other stripants.

Figure 7:
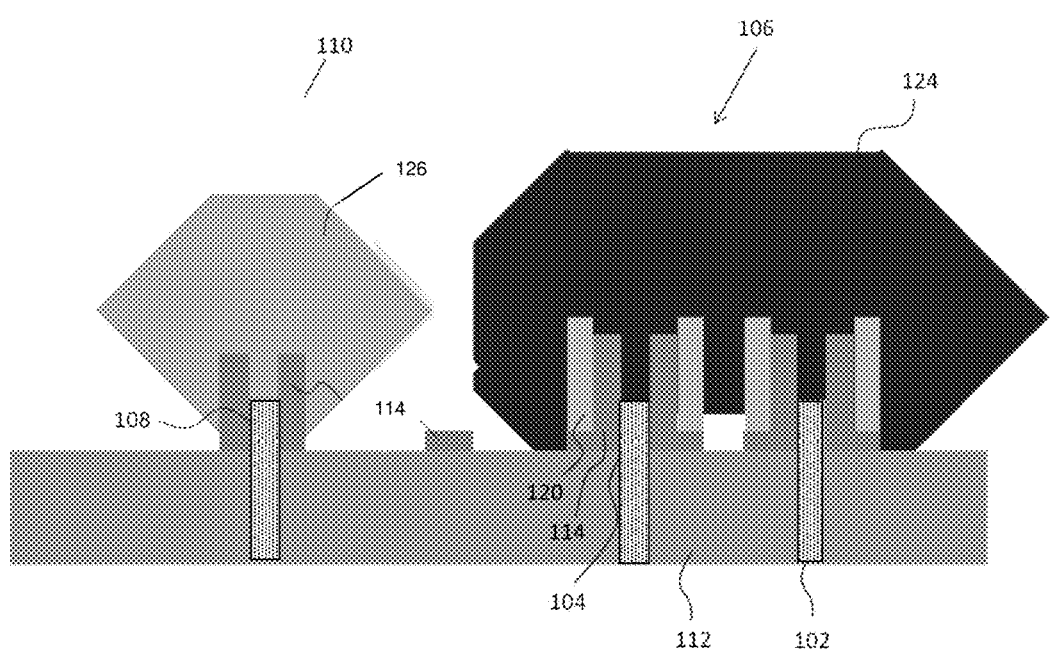
FIG. 7 shows removal of the blocking layer between the epitaxial layers for a PFET structure and NFET structure, amongst other features, and respective fabrication processes in accordance with aspects of the present disclosure

FIG. 7 shows the structure of FIG. 6 after an optional step is performed of removing the N-P boundary or barrier 122. As shown in FIG. 7, a portion of the spacer material 114 can remain on the upper surface of the STI 112 substrate to avoid an unnecessary removal step. In embodiments, the N-P boundary or barrier 122 can be removed by a RIE process, with selective chemistries.

Following the above described processing steps, source and drain regions can be formed using the epitaxial layers 124 and 126 in accordance with conventional processes. e.g., ion implantation. In alternate embodiments, the epitaxial layers 124 and 126 can be in-situ doped to form the raised source and drain regions. Subsequently, metallization structures, e.g., wiring structures, interconnect structures, are formed by conventional lithography, etching and deposition methods known to those of skill in the art to complete formation of the PFET device 106 and the NFET device 110.

For example, an insulator layer can be formed over the epitaxial layers. A resist formed over the insulator layers is exposed to energy (light) to form a pattern (opening). An etching process with a selective chemistry, e.g., RIE, will be used to form one or more trenches in the insulator material through the openings of the resist. The resist can then be removed by a conventional oxygen ashing process or other known stripants. Following the resist removal, conductive material can be deposited by any conventional deposition processes, e.g., chemical vapor deposition (CVD) processes. Any residual material on the surface of the insulator material can be removed by conventional chemical mechanical polishing (CMP) processes. It is also noted that a Vdd power supply wiring is typically formed on one of the epitaxial layers during processing, with the blocking layer 118 serving to prevent undesirable expansion of the epitaxial layer on finFET structures from expanding into contact with the Vdd power supply wiring.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming a plurality of fin structures;
    forming a blocking layer between a first fin structure of the plurality of fin structures and a second fin structure of the plurality of fin structures;
    forming a spacer along sidewalls of the first fin structure;
    forming an epitaxial material on the first fin structure, while blocking the epitaxial material from extending onto the second fin structure by the blocking layer formed between the first fin structure and the second fin structure;
    forming an insulator material on the first fin structure and the second fin structure, prior to forming of the blocking layer;
    forming a mask material over the second fin structure, prior to forming of the blocking layer;
    depositing a blocking material used for the blocking layer on the first fin structure and the mask material, prior to forming of the blocking layer; and
    removing horizontal portions of the blocking material on the mask material and the first fin structure to form the blocking layer and the spacer along the sidewalls of the first fin structure,
    wherein the blocking layer prevents the epitaxial material formed on the first fin structure from extending beyond the blocking layer, removing portions of the insulator material to expose semiconductor material of the first fin structure, and
    the forming the epitaxial material is a growth process formed on exposed semiconductor material of the first fin structure.

2. The method of claim 1, wherein the insulator layer and the blocking material prevents the epitaxial material from forming on the second fin structure.

3. The method of claim 1, wherein the exposed semiconductor material of the first fin structure further comprises removing a portion of the insulator material on the first fin structure, followed by a recess of the exposed semiconductor material.

4. The method of claim 1, wherein the blocking layer and the spacer are formed in a single etching step.

5. The method of claim 1, further comprising forming another epitaxial material on the second fin structure, while protecting the epitaxial material on the first fin structure.

6. The method of claim 5, further comprising:
    forming the epitaxial material on the exposed portion of the first fin structure, while the insulator material and the blocking material are on the second fin structure;
    protecting the epitaxial material, while exposing semiconductor material of the second fin structure; and
    forming the another epitaxial material on the second fin structure while the blocking layer formed between the first fin structure and the second fin structure prevents the another epitaxial material on the second fin structure from expanding on the epitaxial material on the first fin structure.

7. The method of claim 1, wherein the first fin structure is a first device and second fin structure is a second device.

8. The method of claim 1, wherein the blocking layer is comprised of a metal oxide or metal nitride.

9. The method of claim 8, wherein the metal oxide is of $Al_2O_3$.

10. A method comprising:
    forming a first fin structure for a first device type;
    forming a second fin structure for a second device type adjacent to the first device type;
    forming an insulator material on the first fin structure and the second fin structure, prior to forming of a blocking material;
    forming a mask over the first fin structure, prior to forming of the blocking material;
    forming the blocking material over the second fin structure and the mask;
    removing horizontal portions of the blocking material on the mask material and the second fin structure to leave the blocking material on a sidewall of the second fin structure and a sidewall of the mask;
    removing the mask to form a vertical blocking layer at a boundary between the first device type and the second device type;
    forming a spacer along sidewalls of the first fin structure; and
    growing an epitaxial layer on the second fin structure, while the vertical blocking layer prevents the epitaxial layer extending beyond the boundary,
    wherein the blocking material prevents the epitaxial layer formed on the second fin structure from extending beyond the blocking material, removing portions of the insulator material to expose semiconductor material of the first fin structure, and
    the forming the epitaxial layer is a growth process formed on exposed semiconductor material of the second fin structure.

11. The method of claim 10, wherein the first device type and the second device type are different types of devices.

12. The method of claim 10, wherein the partially removing the blocking material forms another spacer on the second fin structure.

13. The method of claim 10, further comprising forming another spacer on sidewalls of the second fin structure from the blocking material deposited on the second fin structure followed by a recess etching process.

14. The method of claim 10, wherein the blocking material is comprised of a metal oxide or metal nitride.

15. The method of claim 14, wherein the metal oxide is of $Al_2O_3$.

* * * * *